(12) United States Patent
Morita et al.

(10) Patent No.: US 7,394,090 B2
(45) Date of Patent: Jul. 1, 2008

(54) NON-VOLATILE MEMORY AND THE FABRICATION METHOD

(75) Inventors: Kiyoyuki Morita, Joetsu (JP); Noboru Yamada, Hirakata (JP); Akihito Miyamoto, Hirakata (JP); Takashi Ohtsuka, Toyonaka (JP); Hideyuki Tanaka, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/798,364

(22) Filed: May 14, 2007

(65) Prior Publication Data

US 2007/0210362 A1    Sep. 13, 2007

Related U.S. Application Data

(60) Division of application No. 10/980,309, filed on Nov. 4, 2004, now Pat. No. 7,232,703, which is a continuation of application No. PCT/JP2004/006485, filed on May 7, 2004.

(30) Foreign Application Priority Data

May 9, 2003    (JP)    ............................. 2003-131338

(51) Int. Cl.
*H01L 47/00*    (2006.01)
(52) U.S. Cl. .................... 257/4; 257/295; 257/E27.104; 257/E21.663
(58) Field of Classification Search ................. 257/2–4, 257/E27.104, E21.663, 295, 296, 298, 300
See application file for complete search history.

(56) References Cited

U.S. PATENT DOCUMENTS 5,789,303 A    8/1998   Leung et al.
5,910,699 A    6/1999   Namba et al.
6,097,050 A    8/2000   Hartner et al.
6,314,014 B1  11/2001   Lowrey et al.
6,797,979 B2   9/2004   Chiang et al.
6,894,305 B2   5/2005   Yi et al.
6,906,376 B1   6/2005   Hsu et al.
7,037,749 B2   5/2006   Horii et al.

(Continued)

FOREIGN PATENT DOCUMENTS

JP    07-022578    1/1995

(Continued)

*Primary Examiner*—Phat X. Cao
*Assistant Examiner*—Abul Kalam
(74) *Attorney, Agent, or Firm*—McDermott Will & Emery LLP

(57) ABSTRACT

A non-volatile memory comprising: a first substrate (100) and a second substrate (110), the first substrate (100) having a plurality of switching elements (4) arranged in matrix, and a plurality of first electrodes (18) connected to the switching element (4), the second substrate (110) having a conductive film (32), and a recording layer (34) whose resistance value changes by application of an electric pulse, wherein the plurality of first electrodes (18) are integrally covered by the recording layer (34), the recording layer (34) thereby being held between the plurality of first electrodes (18) and the conductive film (32); the first substrate (100) further comprising a second electrode (22), the second electrode (22) being electrically connected to the conductive film (32), the voltage of which is maintained at a set level while applying current to the recording layer (34). This non-volatile memory achieves high integration at low cost.

29 Claims, 10 Drawing Sheets

U.S. PATENT DOCUMENTS

| | | |
|---|---|---|
| 7,116,593 B2 * | 10/2006 | Hanzawa et al. ............ 365/203 |
| 2003/0214857 A1 | 11/2003 | Horie et al. |
| 2004/0051161 A1 | 3/2004 | Tanaka et al. |
| 2004/0184331 A1 | 9/2004 | Hanzawa et al. |
| 2005/0027409 A1 | 2/2005 | Marshall et al. |
| 2005/0270832 A1 | 12/2005 | Chu et al. |

FOREIGN PATENT DOCUMENTS

| | | |
|---|---|---|
| JP | 08-227980 | 9/1996 |
| JP | 9-512964 | 12/1997 |
| JP | 11-204742 | 7/1999 |
| JP | 2001-501370 A | 1/2001 |
| JP | 2003-100991 A | 4/2003 |
| WO | WO 03/085740 A1 | 10/2003 |

* cited by examiner (a)

NON-VOLATILE MEMORY AND THE FABRICATION METHOD

This application is a divisional of Application Ser. No. 10/980,309 filed on Nov. 4, 2004, now U.S. Pat. No. 7,232,703, which is a continuation of PCT/JP2004/006485 filed May 7, 2004, which claims priority of Japanese Application No. 2003-131338, filed May 9, 2003, the contents of which are hereby incorporated by reference.

TECHNICAL FIELD

The present invention relates to a non-volatile memory and a fabrication method thereof, and more particularly to a non-volatile memory in which data can be recorded (written) or deleted by using the application of current to control resistance value variations, and to the fabrication method thereof.

BACKGROUND ART

Ferroelectric memory is known as a conventional non-volatile memory. For example, Japanese Unexamined Patent Publication No. 1996-227980 (in particular, FIG. 9) discloses a structure in which a ferroelectric material is used as a material for a capacitor insulating film of a DRAM (Dynamic Random Access read write Memory). This ferroelectric memory is fabricated by attaching a substrate on which a capacitor is formed and a substrate on which a switching element is formed into a united body.

Specifically, as shown in FIG. 9(a) attached with the present specification, a transistor Tr is formed on a silicon substrate 61, and a first substrate S1 is then formed to which a titanium nitride film 63 exposed to the surface is connected to an n⁻ type region 62.

As also shown in FIG. 9(a), by forming a BSTO ($Ba_{0.5}Sr_{0.5}TiO_3$) film 65 on a monocrystalline Nb-doped STO ($SrTiO_3$) substrate 64 and a platinum film 66 on the BSTO film 65, a second substrate S2 comprising a capacitor C is obtained.

The thus obtained first substrate S1 and second substrate S2 are joined to each other and made thinner until the thickness thereof reaches a predetermined value, an isolation region 67 as shown in FIG. 9(b) is then formed, obtaining a DRAM memory cell. The isolation region 67 is composed of a first isolation region 67a that separates adjacent transistors Tr in the first substrate S1 from each other and a second isolation region 67b that separates adjacent capacitors C in the second substrate S2 to each other.

An equivalent circuit comprising such memory cells arranged in a matrix is shown in FIG. 10. As shown in FIG. 10, a gate of each switching element Tr is connected to a word line WL, and a drain of each switching element Tr is connected to a bit line BL. A source of each switching element Tr is connected to one of the electrodes of each capacitor C and a plate wire PL is connected to the other electrode of each capacitor C. Writing to each memory cell is conducted by applying voltage to either the bit line BL or plate wire PL while the word line WL is in an ON-state, and the data is read by detecting inversion of polarization of the ferroelectric while applying voltage to the capacitor C.

In the above-described conventional method for fabricating a semiconductor memory, it is possible to reduce the level of accuracy necessary for joining the first substrate S1 having a switching element Tr to the second substrate S2 having a capacitor C. However, in a ferroelectric memory having a structure as shown in FIG. 9(a), in addition to forming the first isolation region 67a in the first substrate S1 comprising the switching element Tr, it is necessary to form the second isolation region 67b in the second substrate S2 comprising the ferroelectric capacitor C. Therefore, in a conventional technique, as shown in FIG. 9(b), after attaching the first substrate S1 to the second substrate S2, the isolation region 67 is formed, i.e., the first isolation region 67a and the second isolation region 67b are formed at the same time. However, even in such a fabrication method, a complicated fine processing step employing photolithography is still necessary for the second substrate S2. This problem has become more significant as the degree of integration has increased.

Furthermore, in the above-described method for fabricating a semiconductor memory, it is necessary to construct the memory so that the voltage applied from the plate wire PL to the capacitor C shown in FIG. 10 can be controlled; however, a concrete structure for meeting this requirement has not been disclosed and there is a room for further improvement in terms of ease of fabrication.

As well as ferroelectric memories, a memory using the characteristic that the resistance value of a bulk changes depending on the condition of crystalline (so-called a phase-change memory) is known as a non-volatile memory. For example, Japanese Unexamined Patent Publication No. 1999-204742, U.S. Pat. No. 6,314,014, etc., disclose such memories; however, none of these publications discloses a means for solving the above problem.

DISCLOSURE OF THE INVENTION

The present invention aims at providing a non-volatile memory that achieves high integration at low cost and a method for fabricating such a non-volatile memory.

An object of the present invention can be achieved by a non-volatile memory comprising:

a first substrate and a second substrate, the first substrate having a plurality of switching elements arranged in a matrix, and a plurality of first electrodes connected to the switching elements, the second substrate having a conductive film, and a recording layer whose resistance value changes by application of an electric pulse, wherein the plurality of first electrodes are integrally covered by the recording layer, the recording layer thereby being held between the plurality of first electrodes and the conductive film, the first substrate further comprising a second electrode, and the second electrode being electrically connected to the conductive film, the voltage of which is maintained at a certain level while applying current to the recording layer.

Another object of the present invention can be achieved by a method for fabricating a non-volatile memory comprising an alignment step for aligning and connecting a first substrate and a second substrate, the first substrate having a plurality of switching elements arranged in a matrix, and a plurality of first electrodes connected to the switching elements, the second substrate having a conductive film, and a recording layer whose resistance value changes by application of an electric pulse, wherein the first substrate further comprises a second electrode the voltage of which is maintained at a certain level while applying current to the recording layer, in the alignment step, a first electrode connecting step in which the recording layer is held between the plurality of first electrodes and the conductive film by covering the plurality of first electrodes with the recording layer in a united manner, and a second electrode connection step for electrically connecting the second electrode to the conductive film or the recording layer are conducted at the same time.

BEST MODE FOR CARRYING OUT THE INVENTION

Figure 1:
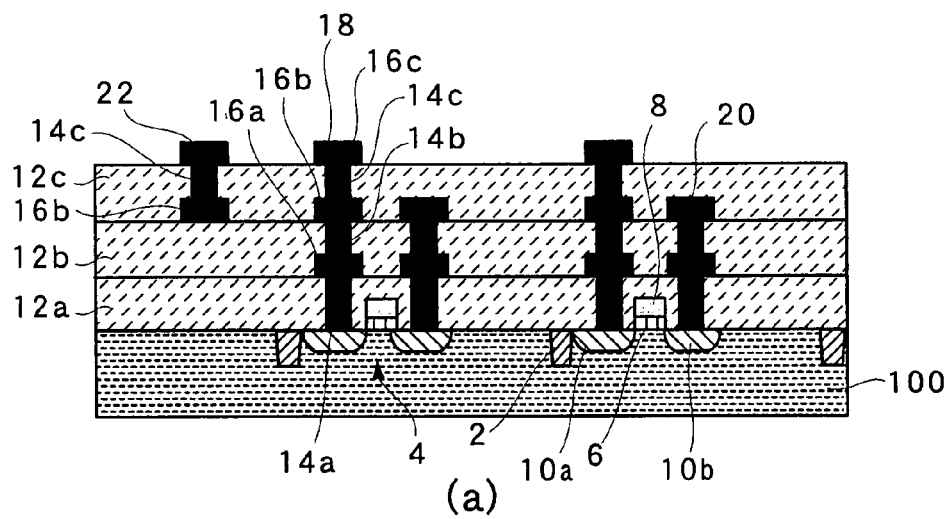
FIGS. 1(a) to 1(c) are cross-sectional views explaining steps for fabricating a non-volatile memory according to one embodiment of the present invention.
Figure 1:
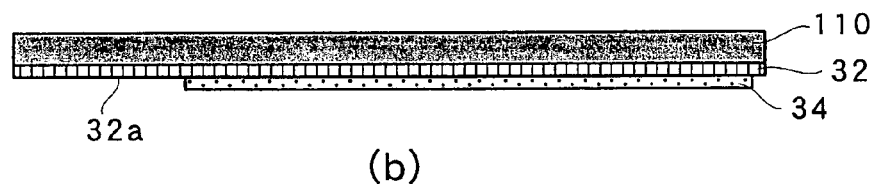
Figure 1:
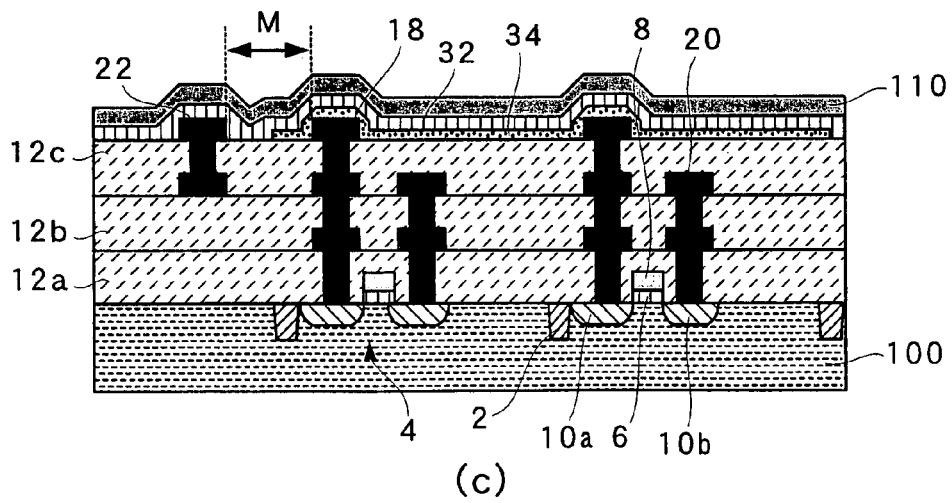

Embodiments of the present invention are explained below with reference to the drawings. FIG. 1 is a cross-sectional view explaining steps for fabricating a non-volatile memory according to one embodiment of the present invention.

An isolation region 2 is first formed in a lower substrate 100, which is a p-type semiconductor substrate, as shown in FIG. 1(a), employing, for example, an STI (Shallow Trench Isolation) technique, and a plurality of switching elements 4 each composed of an n-type transistor is then formed by a general silicon semiconductor fabrication process. Each switching element 4 comprises a gate electrode 8 formed above the lower substrate 100 via a gate insulating film 6, a source region 10a and a drain region 10b formed in the lower substrate 100, the source region 10a and the drain region 10b being formed on each side of the gate insulating film 6 and being composed of an n-type diffusion layer.

An interlayer insulating film 12a is then formed on the lower substrate 100 in such a manner to cover the switching elements 4. A plurality of contact holes extending through to the source region 10a and the drain region 10b are formed in the interlayer insulating film 12a, and a plug 14a is then formed therein by implanting tungsten and/or like metal materials in the contact holes by selective CVD (Chemical Vapor Deposition), etc. After depositing a metal layer on the interlayer insulating film 12a by sputtering, etc., the metal layer is subjected to patterning by photolithography, forming a metal wire 16a connected to the plug 14a. Thereafter, an interlayer insulating film 12b is formed on the entire surface of the interlayer insulating film 12a so as to cover the top surface of the metal wire 16a; a contact hole is formed to extend through to the metal wire 16a; and a plug 14b and a metal wire 16b connected to the plug 14b are formed in the same manner as above. By selectively forming contact holes while repeating these processes, a multilayer interconnection structure is formed in which the heights of the metal wires connected to the source region 10a and the drain region 10b are different. In other words, an interlayer insulating film 12c, a plug 14c and a metal wire 16c are further formed on the interlayer insulating film 12b. The metal wire 16c exposed from the interlayer insulating film 12c is connected to the source region 10a of the switching element 4 as a source electrode (first electrode) 18. Among the metal wires 16b formed in the interlayer insulating film 12b, those that do not have a contact with the plug 14c are made to contact with the drain region 10b of the switching element 4 as a bit line 20.

In a step for forming metal wires 16b on the interlayer insulating film 12b, by forming a metal wire 16b, which is connected to neither the source region 10a nor the drain region 10b, one of the metal wires 16c formed on the interlayer insulating film 12c is made into a constant-voltage electrode (second electrode) 22. The constant-voltage electrode 22 is formed on the same layer on which a source electrode 18 is formed and maintained at a constant voltage. The lower substrate 100 comprising the switching element 4, source electrode 18 and constant-voltage electrode 22 is thus obtained.

In contrast, as shown in FIG. 1(b), an upper substrate 110 is formed by forming a conductive film 32 composed of a metal thin film on the surface of the upper substrate by sputtering, etc., subjecting the conductive film 32 to patterning in a photolithography step, forming a recording layer 34 composed of a phase-change film on the surface of the conductive film 32 by sputtering, etc., and subjecting the recording layer 34 to patterning. The size of the recording layer 34 is such that the layer covers the entire memory cell and the conductive film 32 is formed over an area greater than that of the recording layer 34. This makes a portion of the conductive film 32 be an exposed portion 32a, which is not covered with the recording layer 34.

The upper substrate 110 may be preferably formed, for example, by using polycarbonate (PC), polyethylene terephthalate (PET) and/or like organic materials having a high heat resistance; however, inorganic materials may be used as long as they have adequate elasticity. For example, it is possible to use a thin film silicon substrate, ceramic substrate, FRP substrate, etc., as the upper substrate 110. It is preferable that the conductive film 32 be composed of a metal, in which diffusion hardly occurs, such as W, Pt, Pd, etc.

Figure 2:
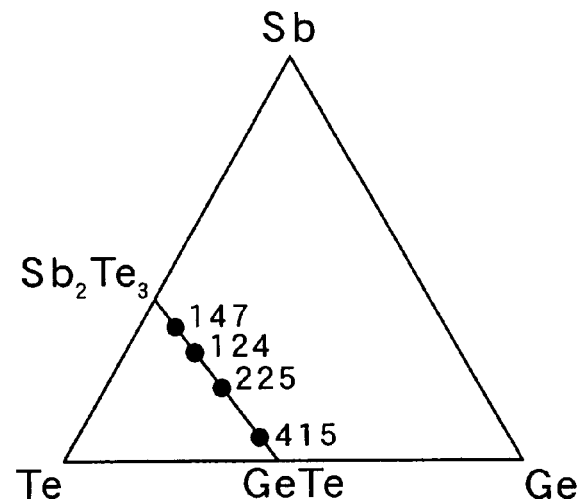
FIG. 2 is a phase diagram of a GeSbTe compound.

A phase-change material having at least two stable phases of differing resistance values and capable of being reversibly switched these between is preferably used as the material for the recording layer 34. In the present embodiment, GeSbTe, which is a chalcogenide compound having Ge, Sb and Te as its main components, is used. It is also possible to use chalcogenide-based materials combining Ge, Sb and Te with Ag and/or In, etc., for example, AgInSbTe, AgInSbGeTe, GeInSbTe, etc. By appropriately selecting the types of elements and the ratios thereof, the melting point of the recording layer 34 can be controlled. For example, when a GeSbTe compound is used, in the phase diagram shown in FIG. 2, compounds between $Sb_2Te_3$ and GeTe are preferable, for example, (225) in the figure, i.e., $Ge_2Sb_2Te_5$ and the like are preferably used.

Examples of materials for the recording layer 34 other than chalcogenide-based materials include $(R_{1-x}, A_x)MnO_3$, wherein R is a rare-earth metal, A is an alkaline-earth metal, and 0<x<1. Pr, Gd and/or La may be used as rare-earth metal R and Ca, Ba, Sr, etc., may be used as the alkaline-earth metal A. Among these, in particular, when $(Pr_{0.7}, Ca_{0.3})MnO_3$, $(Gd_{1-x}, Ba_x)MnO_3$, $(La_{1-x}, Sr_x)MnO_3$ or the like is used, semiconductor elements having excellent characteristics can be obtained. It is also possible to use $(R_{1-x}, A_x)CoO_3$, wherein Mn in $(R_{1-x}, A_x)MnO_3$ is replaced with Co.

The lower substrate 100 and the upper substrate 110 are then joined to each other after being aligned as shown in FIG. 1(c). Specifically, a plurality of source electrodes 18 are simultaneously attached to the recording layer 34 in a united manner and aligned so that the constant-voltage electrode 22 is connected to the exposed portion 32a of the conductive film 32, completing a non-volatile memory.

When the lower substrate 100 and the upper substrate 110 are joined to each other, by conducting a suitable heat treatment, it is possible to strengthen the attachment between the source electrode 18 and the recording layer 34, and between the constant-voltage electrode 22 and the conductive film 32. Specific examples of heat treatment include use of an electric furnace or hot plate, and use of a lamp annealer for a short time of period. It is also possible to conduct heat treatment by applying millimeterwave or microwave radiation from the main surface side (the side where the switching element 4 is formed) of the lower substrate 100 and blocking the release of the waves from the opposite side. In this method, because the source electrode 18 and the constant-voltage electrode 22 are heated first, the portion of the recording layer 34 to be attached to the source electrode 18 and the portion of the conductive film 32 to be attached to the constant-voltage electrode 22 can be selectively heated, obtaining a strong attachment. The portions to be heated do not necessarily have to be the above-described portions and, for example, even when the lower substrate 100 is first heated by applying millimeterwave or microwave radiation from the direction opposite to that mentioned above, using a hotplate, etc., the heat can be effectively transmitted to the source electrode 18 and the constant-voltage electrode 22 that are formed of metal, and therefore it is still possible to obtain a strong attachment between the lower substrate 100 and the upper substrate 110.

Figure 3:
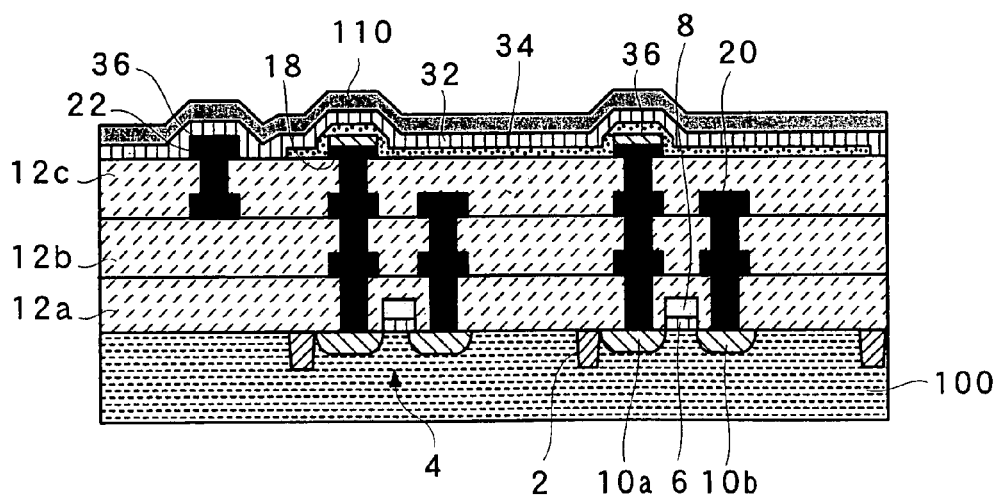
FIG. 3 is a schematic cross-sectional view of a modified example of the non-volatile memory shown in FIG. 1(c).

In addition to the methods described above, an adhesion layer may be laid between the lower substrate 100 and the upper substrate 110 to enhance the strength of the attachment therebetween. In other words, as shown in FIG. 3, after forming adhesion layers 36 on the top surfaces of the source electrode 18 and the constant-voltage electrode 22, the lower substrate 100 and the upper substrate 110 are joined to each other, with adhesion layers 36 lying between the source electrode 18 and the recording layer 34, and between the constant-voltage electrode 22 and the conductive film 32. When the adhesion layer 36 is thin (for example, not more than 10 nm), the adhesion layer 36 may be formed on the entire surface of the lower substrate 100 not only the top surfaces of the source electrode 18 or the constant-voltage electrode 22. In FIG. 3, the components the same as those shown in FIG. 1(c) have the same reference numbers.

Sn, In, Pb and like low melting point metals, Ge, conductive polymers, etc., are preferably used as materials for the adhesion layer 36. It is preferable that such a conductive polymer have resistance anisotropy exhibiting high resistivity in the main plane direction and low resistivity in the direction perpendicular to the main plane. In this case, it is possible to form the adhesion layer 36 on the surface of the recording layer 34 instead of forming the adhesion layer 36 on the lower substrate 100. Alternatively, low melting point phase-change materials composed of Ge, Sb, Te, etc., may be used as the adhesion layer 36. In this case, it is preferable that the adhesion layer 36 be prevented from forming on top of the constant-voltage electrode 22 by using a suitable mask while forming the adhesion layer 36.

To reduce the connection area between the source electrode 18 and the recording layer 34, it is also possible to form metal fine particles having a diameter of not more than 100 nm or fine pits and projections by ion irradiation, etc., on the surface of the source electrode 18 and/or the recording layer 34. This increases the current density while applying current to the recording layer 34, reducing power consumption of the memory.

Figure 4:
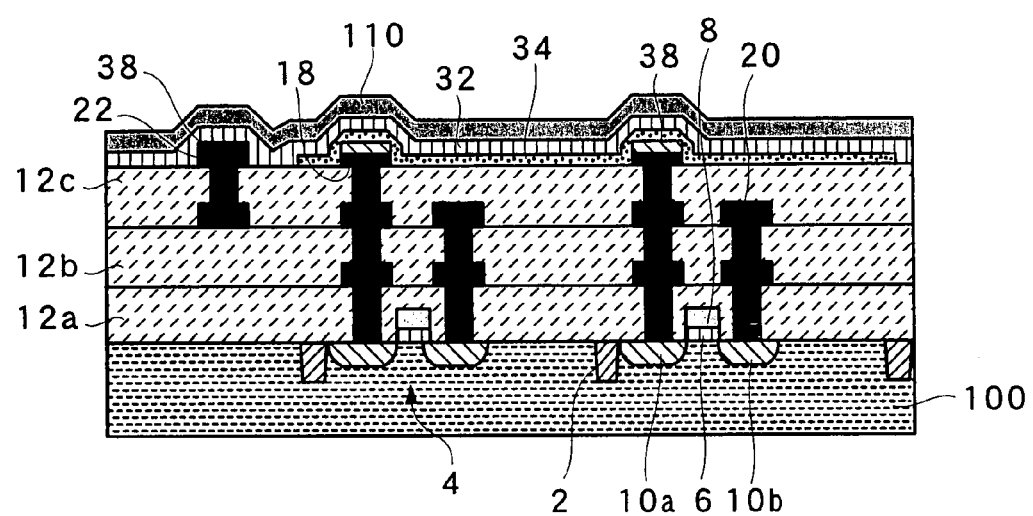
FIG. 4 is a schematic cross-sectional view of another modified example of the non-volatile memory shown in FIG. 1(c).

To decrease the connection area between the source electrode 18 and the recording layer 34, it is also possible to pattern an insulating layer 38 on top of the source electrode 18 as shown in FIG. 4 and then join the lower substrate 100 to the upper substrate 110. In FIG. 4, the components the same as those shown in FIG. 1(c) have the same reference symbols.

In this structure, because the insulating layer 38 lies in a portion of the interface between the source electrode 18 and the recording layer 34 (i.e., on top of the source electrode 18), the source electrode 18 connects to the recording layer 34 only at the side surfaces, reducing the connection area compared to the structure shown in FIG. 1(c). As a result, operation with saved energy becomes possible. In addition to formation of the insulating layer 38, by laying fine metal particles or forming pits and projections in the connecting portion, energy consumption can be further reduced. In FIG. 4, the insulating layer 38 is also formed on the constant-voltage electrode 22, and this may be removed in a separate step.

In the non-volatile memory of the present embodiment, the lower substrate 100 needs an isolation region as in conventional non-volatile memories; however, the isolation region can be formed by a standard silicon semiconductor fabrication process step and no additional steps are necessary. A complicated fine processing step becomes unnecessary in formation of the upper substrate 110, simplifying the whole fabrication process.

Figure 9:
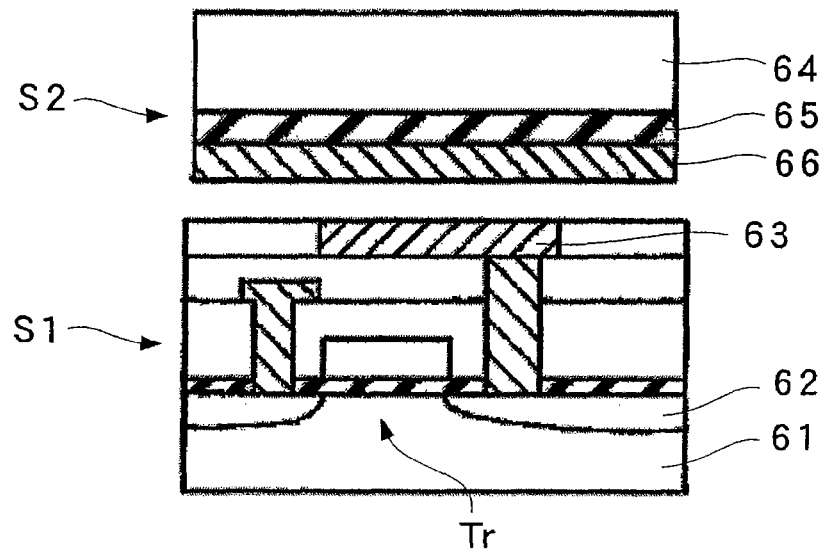
FIGS. 9(a) and 9(b) are cross-sectional views explaining steps for fabricating a conventional non-volatile memory.
Figure 9:
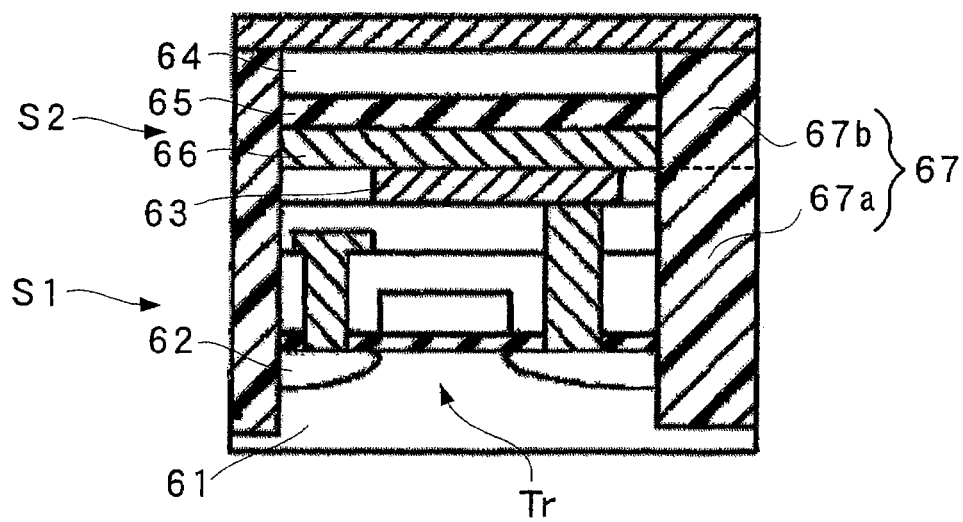

In other words, the recording layer 34 formed on the upper substrate 110 has a size that can cover the entire memory region so as to be connected to all source electrodes 18, and the recording layer 34 is generally formed to have a pattern width of not less than 100 μm. The portion of the conductive film 32 exposed to the lower substrate 100 may be formed in any location, for example, by forming the exposed portion around the periphery of the memory region and obtaining enough space for the region, the alignment margin of the lower substrate 100 and the upper substrate 110 can be increased. The alignment margin corresponds to the distance M (see FIG. 1(c)) between the constant-voltage electrode 22 and the source electrode 18 that is adjacent to the constant-voltage electrode 22, and may be set at within the range from 1 to 50 μm. As a result, with respect to the upper substrate 110, the pattern layout requirements are eased. Furthermore, in the non-volatile memory of the present embodiment, in contrast to a conventional ferroelectric memory (see FIG. 9(b)), it is not necessary to form an isolation region in the upper substrate 110 having the recording layer 34. Therefore, the upper substrate 110 does not need a fine processing step before and after being joined to the lower substrate 100. This makes the fabrication process easier compared to conventional non-volatile memories and thus highly integrated non-volatile memories can be fabricated at low cost.

Figure 11:
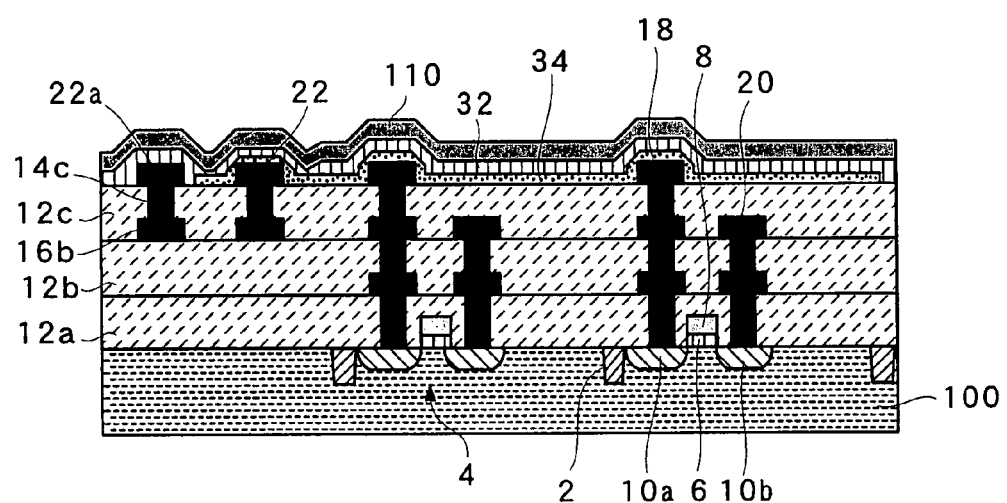
FIG. 11 is a schematic cross-sectional view showing a modified example of the non-volatile memory shown in FIG. 1(c).

In the non-volatile memory of the present embodiment, as shown in FIG. 11, an auxiliary electrode 22a adjacent to the constant-voltage electrode 22 may be formed in the same layer in which the constant-voltage electrode 22 is formed. In FIG. 11, the components the same as those shown in FIG. 1(c) have the same reference numbers.

In this structure, even when the constant-voltage electrode 22 is connected to the recording layer 34 by being covered with the recording layer 34 due to misalignment between the lower substrate 100 and the upper substrate 110, as shown in FIG. 11, by applying current across the constant-voltage electrode 22 and the auxiliary electrode 22a, it is possible to make the energized region in the recording layer 34 crystalline so as to have a low resistivity. Therefore, the constant-voltage electrode 22 can function in the same manner as in the structure shown in FIG. 1(c). This makes the alignment between the lower substrate 100 and the upper substrate 110 even easier and decreases the alignment margin (distance M in FIG. 1(c)), miniaturizing the semiconductor. In the structure shown in FIG. 11, the auxiliary electrode 22a is not covered by the recording layer 34; however, even when both the constant-voltage electrode 22 and the auxiliary electrode 22a are covered by the recording layer 34 (see FIG. 8 described later), no problems arise.

In such a structure, when, in a latter step, the energized region in the recording layer 34 is made to have high resistivity by being irradiated with laser light, etc., there is a possibility that the function of the constant-voltage electrode 22 may be impaired. Therefore, it is preferable that the portion above the energized region in the recording layer 34 is shielded from light by using a material having a low transparency for the upper substrate 110, etc.

Figure 5:
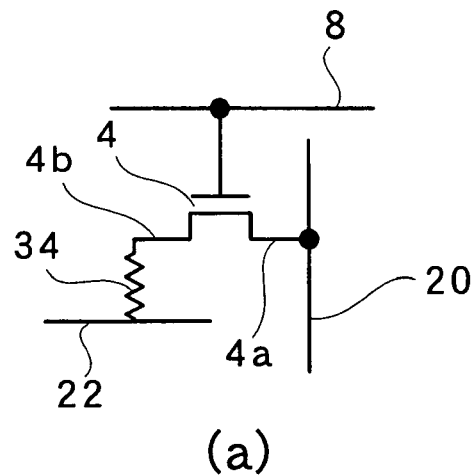
FIGS. 5(a) and 5(b) are circuit diagrams of a non-volatile memory according to one embodiment of the present invention.
Figure 5:
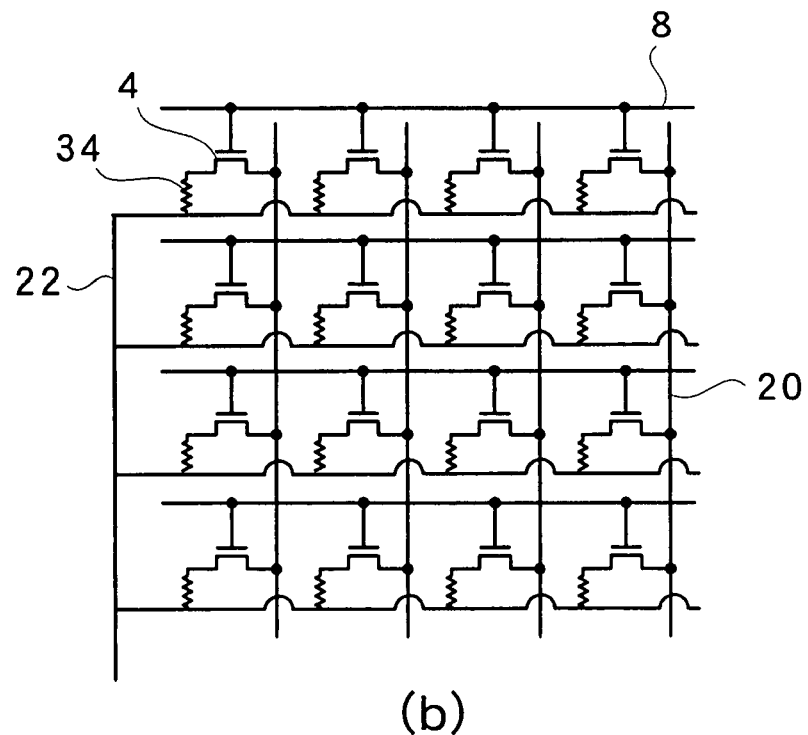
Figure 10:
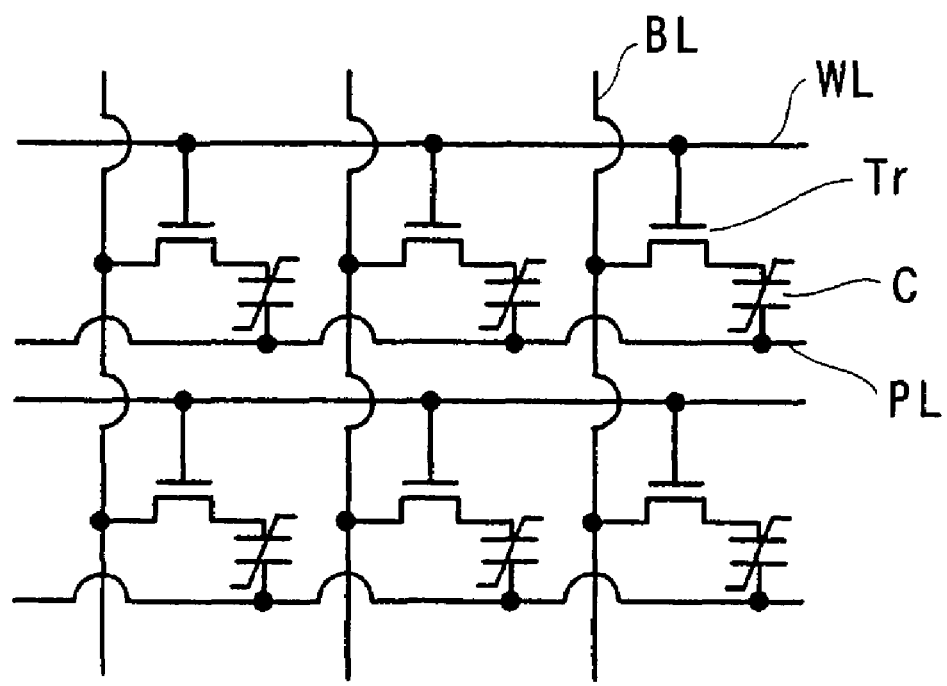
FIG. 10 is a circuit diagram of a conventional non-volatile memory.

FIG. 5 is an equivalent circuit diagram of the non-volatile memory shown in FIG. 1(c), wherein FIG. 5(a) shows a single cell and FIG. 5(b) shoes a plurality of cells arranged in matrix. A single cell comprises a switching element 4 and a recording layer 34. The gate electrode 8 of the switching element 4 is a word line and the drain portion 10b is connected to the bit line 20. The source portion 10a of the switching element 4 is connected to one side of the recording layer 34 and the other side of the recording layer 34 is connected to the constant-voltage electrode 22. The constant-voltage electrode 22 is generally a grounding wire; however, as long as the voltage can be maintained at a certain level when current is applied to the recording layer 34, grounding is not necessarily required. This constant-voltage electrode 22 functions differently from a plate wire PL (see FIG. 10) as used in a conventional ferroelectric memory in which voltage is applied when data are written or read.

Chalcogenide compounds, which are used as materials for the recording layer 34 in the present embodiment, exhibit a low electrical resistance in the crystalline state and a high electrical resistance in the amorphous state, and the variance is approximately 1 to 3 digits. Therefore, data can be written or read by allocating crystalline states and amorphous states to the data of "0" and "1" respectively (or "1" and "0") as in a non-volatile memory using a phase-change material.

In FIG. 5(b), when data are read, by applying a predetermined voltage to the bit line 20 and the gate electrode (word line) 8, current is applied to the constant-voltage electrode 22 from the bit line 20 through the switching element 4 and the recording layer 34. Because the volume of the applied current changes depending on the resistance value of the recording layer 34, memory contents in the recording layer 34 can be read based on the amount of current.

To write data, an appropriate voltage is applied to the bit line 20 and the gate electrode (word line) 8 so as to change the crystalline condition of the recording layer 34. To change the recording layer 34 from crystalline (low-resistive state) to amorphous (high-resistive state), after applying current to the recording layer 34 in such a manner that a portion of the recording layer 34 becomes hotter than the crystallization temperature (for example, 600° C.), current is quickly removed. In contrast, to change the recording layer 34 from amorphous (high-resistive state) to crystalline (low-resistive state), current is applied to the recording layer 34 in such a manner that the temperature does not exceed the crystallization temperature of the recording layer 34 and that the recording layer 34 is crystallized. The recording layer 34 generally does not change its resistive condition at a temperature of 200° C. or less and therefore it functions as a non-volatile memory.

The phase-change materials composing the recording layer 34 generally increase their volume by several % to 10% when changed from crystalline to amorphous; however, in the structure of the present embodiment, expansion and shrinkage of the phase-change material is alleviated by the adequate elasticity of the upper substrate 110, preventing breakage of wires in the portion connecting the lower substrate 100 and the upper substrate 110.

Figure 6:
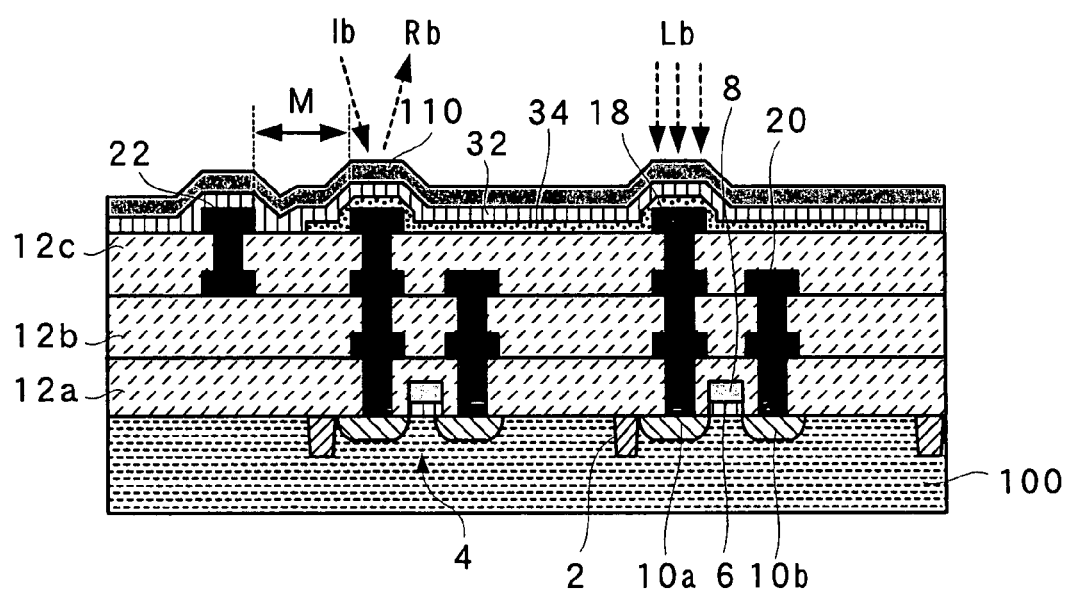
FIG. 6 is a diagram explaining one example of a method for reading and writing a non-volatile memory according to one embodiment of the present invention.

In the non-volatile memory of the present embodiment, data can be written or read not only electrically but also optically using laser light, etc. When data are read, the portion of the recording layer 34 corresponding to an objective memory cell is irradiated with incident laser light Ib as shown in FIG. 6, and the intensity or degree of polarization of the reflected laser light Rb are measured. Polarization of the recording layer 34 is different between the crystalline and amorphous states, and therefore memory can be read based on the difference of the polarization. To effectively transfer the incident laser light Ib, it is preferable that the material for the upper substrate 110 have a high transparency and the conductive film 32 be thin. Specifically, it is preferable that the thickness of the conductive film 32 be from 3 to 10 nm. By constructing each cell so that its weighting factor, etc., can be read optically, the circuit can be miniaturized compared to circuits in which data are read electrically. Such a structure is useful for, for example, constructing a neural network. When prevention of optical reading or writing of data is necessary, it is preferable that the transparency of the upper substrate 110 be low and/or the conductive film 32 be thicker than 10 nm.

In the present embodiment, data can be written by following the method employed in known DVD disc media. In other words, the recording layer 34 can be changed to an amorphous state by suddenly stopping irradiation after irradiating the portion of the recording layer 34 corresponding to an objective memory cell as shown in FIG. 6 with highly intensive laser light Lb, and the recording layer 34 can be made crystalline by irradiating with a relatively low intensity laser light Lb such that the recording layer 34 does not melt. In this case, by setting the thickness of the conductive film 32 within 3 nm to 10 nm, it is also possible to effectively transmit the laser light Lb and prevent thermal interference to an adjacent memory cell by reducing heat transmission through the conductive film 32. The smaller the memory cell, the shorter the wavelength of the laser light Lb should be. For example, when the wavelength of the laser light Lb is approximately 600 nm to 700 nm, the size of the source electrode 18 can be miniaturized to approximately a square of 0.2 μm per side. As described above, by constructing the cell to be optically writable, an electrical writing circuit becomes unnecessary. This makes it possible to readily fabricate a neural network, which performs optimizations by changing the weighting factor in a later step, at low cost.

The non-volatile memory of the present embodiment uses an n-channel-type MOSFET as a switching element 4; however, it is also possible to use a p-channel-type MOSFET by forming an n-well region in the lower substrate 100, etc.

Alternatively, another FET, bipolar element, HEMT (High Electron Mobility Transistor) or like transistor having three or more terminals may be used as the switching element 4.

The structure of the memory cell is not limited to that of the present embodiment and, for example, the present invention can be employed to an SRAM (Static Random Access Memory) composed of a flip-flop circuit of six transistors provided with a first n-type switching element 41, a second n-type switching element 42, a first p-type switching element 43, a second p-type switching element 44, a third n-type switching element 45, and a third n-type switching element 46 as shown in FIG. 7(a). In FIG. 7(a), reference numbers 8 and 20 refer to a word line and a bit line, respectively.

Figure 7:
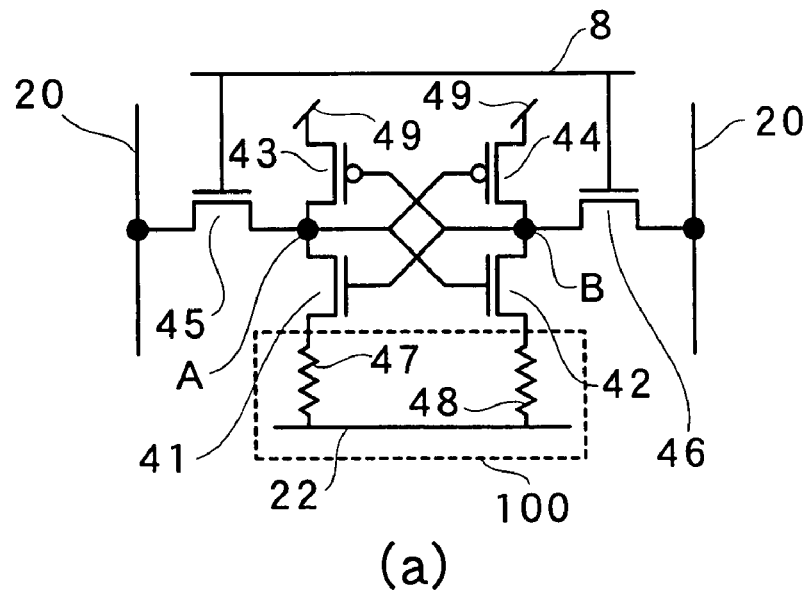
FIGS. 7(a) and 7(b) are circuit diagrams of a non-volatile memory according to one embodiment of the present invention.
Figure 7:
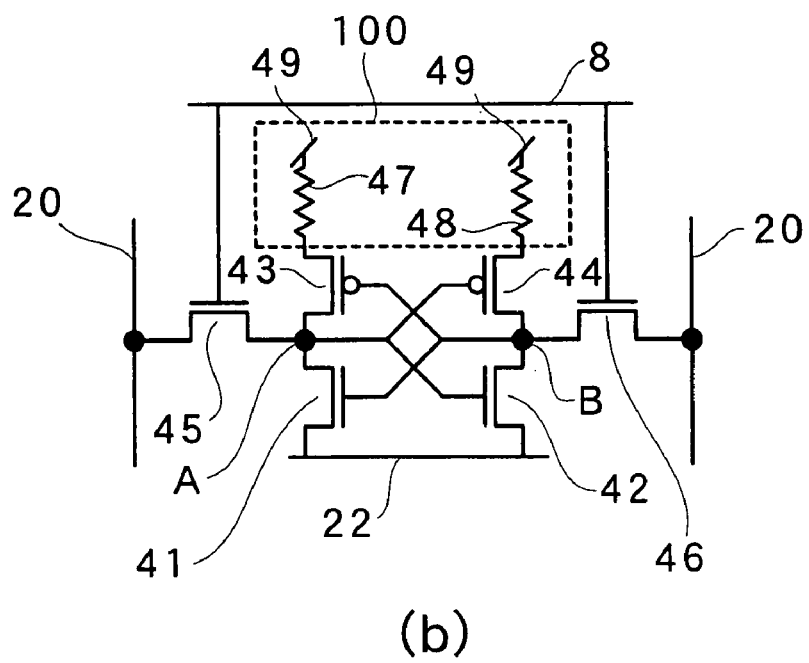

In this case, the cell can be fabricated in the same manner as in the present embodiment by providing a first recording layer 47 and a second recording layer 48 on the lower substrate 100, connecting one end of the first recording layer 47 and that of the second recording layer 48 to the source of the first n-type switching element 41 and that of the second n-type switching element 42, respectively, and connecting the other end of the first recording layer 47 and that of the second recording layer 48 to the constant-voltage electrode 22. In this structure, because the voltages of node A and node B are determined based on the resistance difference between the first recording layer 47 and the second recording layer 48 when power supply to the power wire 49 is turned on, memory can be read based on these voltages. The one end of the first recording layer 47 and that of the second recording layer 48 may be connected to the source of the first p-type transistor 43 and that of the second p-type transistor 44 as shown in FIG. 7(b). In FIG. 7, a plurality of switching elements are formed in which switching elements 41-44 are arranged in a matrix.

Figure 8:
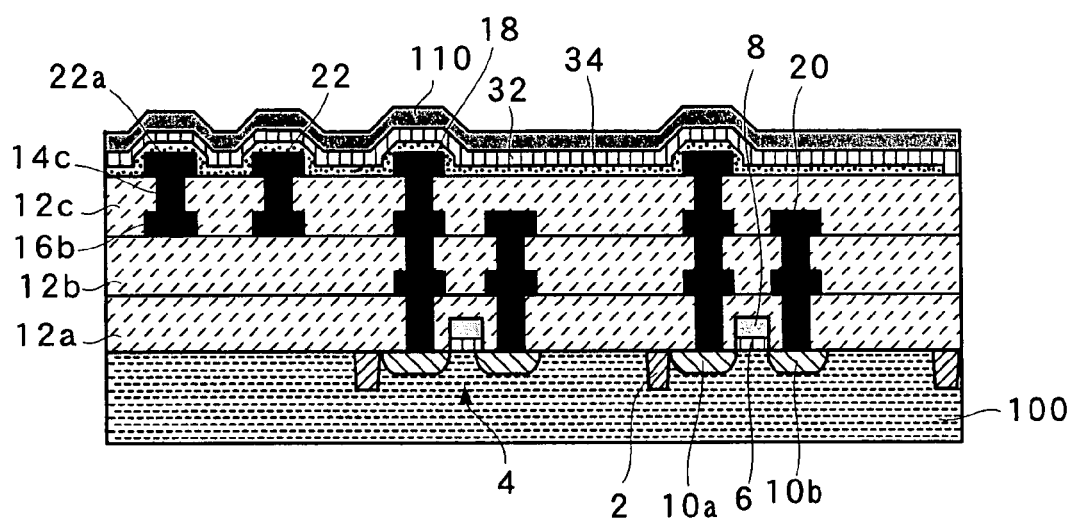
FIG. 8 is a schematic cross-sectional view showing a modified example of the non-volatile memory shown in FIG. 1(c).

In the present embodiment, an exposed portion 32a of the conductive film 32 is formed on the upper substrate 110, and the constant-voltage electrode 22 of the lower substrate 100 is connected to the exposed portion 32a; however, it is also possible to form the recording layer 34 over the entire surface of the conductive film 32 so that the conductive film 32 is not exposed, as shown in FIG. 8. In this case, in the lower substrate 110, by forming the auxiliary electrode 22a adjacent to the constant-voltage electrode 22 on the same layer as the constant-voltage electrode 22, when the lower substrate 100 and the upper substrate 110 are joined to each other, the constant-voltage electrode 22 and the auxiliary electrode 22a are attached to the recording layer 34. In FIG. 8, the components the same as those shown in FIG. 1(c) have the same reference numbers.

In a non-volatile memory having such a structure, by making the energized region in the recording layer 34 crystalline to reduce the resistivity thereof by applying current across the constant-voltage electrode 22 and the auxiliary electrode 22a in advance, it is possible to make the constant-voltage electrode 22 function in the same manner as the structure shown in FIG. 1(c). By structuring the non-volatile memory in such a manner, an alignment margin becomes unnecessary. This makes it possible to further miniaturize the non-volatile memory and fabrication thereof becomes easier. Furthermore, as shown in FIG. 11, it is preferable that the portion above the energized region in the recording layer 34 in this structure be shielded from light.

INDUSTRIAL APPLICABILITY

As described above, the present invention provides a non-volatile memory that can achieve high integration at low cost and a method for fabricating such a memory.

The invention claimed is:

1. A non-volatile memory comprising:
a first substrate and a second substrate,
the first substrate having a plurality of switching elements arranged in a matrix and a plurality of first electrodes connected to the switching elements,
the second substrate having a conductive film, and a recording layer whose resistance value changes by application of an electric pulse, wherein
the plurality of first electrodes are integrally covered by the recording layer, the recording layer thereby being held between the plurality of first electrodes and the conductive film;
the first substrate further comprising a second electrode, and
the second electrode being electrically connected to the conductive film, the voltage of which is maintained at a certain level when current is applied to the recording layer;
wherein the conductive film has an exposed portion not covered by the recording layer,
the first substrate further comprises an auxiliary electrode that is adjacent to the second electrode, and
the second electrode is covered by the recording layer.

2. A non-volatile memory according to claim 1, wherein the first electrode and the second electrode are formed on the same layer of the first substrate.

3. A non-volatile memory according to claim 1, wherein the recording layer has no isolation region.

4. A non-volatile memory according to claim 1, wherein the second electrode is connected to the exposed portion.

5. A non-volatile memory according to claim 4, wherein the distance between the second electrode and the first electrode that is adjacent to the second electrode is not less than 1 μm and not more than 50 μm.

6. A non-volatile memory according to claim 1, wherein the first electrode, second electrode, and auxiliary electrode are formed on the same layer of the first substrate.

7. A non-volatile memory according to claim 1, wherein a portion of the recording layer between the second electrode and the auxiliary electrode is made low resistive by applying current between the second electrode and the auxiliary electrode.

8. A non-volatile memory according to claim 7, wherein the auxiliary electrode is covered by the recording layer.

9. A non-volatile memory according to claim 7, wherein a portion of the top of the recording layer between the second electrode and the auxiliary electrode is shielded from light.

10. A non-volatile memory according to claim 1, wherein each switching element comprises a source region and a drain region formed in the first substrate, and a gate electrode formed on the first substrate,
the first electrode being connected to the source region.

11. A non-volatile memory according to claim 10, wherein the first substrate is a p-type semiconductor substrate,
the source region and the drain region are n-type diffusion layers, and
the second electrode is an electrode for grounding.

12. A non-volatile memory according to claim 10, wherein the gate electrode is formed above the first substrate via a gate insulating film.

13. A non-volatile memory according to claim 1, wherein an adhesion layer lies at least between the first electrode and the recording layer.

14. A non-volatile memory according to claim 1, wherein an insulating layer lies in a portion of the interface between the first electrode and the recording layer.

15. A non-volatile memory according to claim 1, wherein the recording layer comprises a phase-change material having at least two stable phases of different resistance values and capable of being reversibly switched between the phases.

16. A non-volatile memory according to claim 15, wherein the phase-change material contains a chalcogenide material.

17. A non-volatile memory according to claim 1, wherein the thickness of the conductive film is not less than 3 nm and not more than 10 nm.

18. A non-volatile memory comprising:

a first substrate and a second substrate, the first substrate having a plurality of switching elements arranged in a matrix and a plurality of first electrodes connected to the switching elements, the second substrate having a conductive film, and a recording layer whose resistance value changes by application of an electric pulse, wherein the plurality of first electrodes are integrally covered by the recording layer, the recording layer thereby being held between the plurality of first electrodes and the conductive film;

the first substrate further comprising a second electrode, and the second electrode being electrically connected to the conductive film, the voltage of which is maintained at a certain level when current is applied to the recording layer;

wherein the first substrate further comprises an auxiliary electrode disposed adjacent to the second electrode, the recording layer is formed over the entire surface of the conductive film, and the second electrode is covered by the recording layer.

19. A non-volatile memory according to claim 18, wherein the first electrode, second electrode, and auxiliary electrode are formed on the same layer of the first substrate.

20. A non-volatile memory according to claim 18, wherein a portion of the recording layer between the second electrode and the auxiliary electrode is made low resistive by applying current between the second electrode and the auxiliary electrode.

21. A non-volatile memory according to claim 20, wherein the portion of the recording layer between the second electrode and the auxiliary electrode is shielded from light.

22. A non-volatile memory according to claim 18, wherein each switching element comprises a source region and a drain region formed in the first substrate, and a gate electrode formed on the first substrate, the first electrode being connected to the source region.

23. A non-volatile memory according to claim 22, wherein the first substrate is a p-type semiconductor substrate, the source region and the drain region are n-type diffusion layers, and the second electrode is an electrode for grounding.

24. A non-volatile memory according to claim 22, wherein the gate electrode is formed above the first substrate via a gate insulating film.

25. A non-volatile memory according to claim 18, wherein an adhesion layer lies at least between the first electrode and the recording layer.

26. A non-volatile memory according to claim 18, wherein an insulating layer lies in a portion of the interface between the first electrode and the recording layer.

27. A non-volatile memory according to claim 18, wherein the recording layer comprises a phase-change material having at least two stable phases of different resistance values and capable of being reversibly switched between the phases.

28. A non-volatile memory according to claim 27, wherein the phase-change material contains a chalcogenide material.

29. A non-volatile memory according to claim 18, wherein the thickness of the conductive film is not less than 3 nm and not more than 10 nm.

* * * * *